United States Patent

Nation

[15] 3,641,395

[45] Feb. 8, 1972

[54] APPARATUS FOR QUICKLY MOUNTING AND ELECTRICALLY CONNECTING COMPONENTS IN A HOUSING WITH CAMMING CONNECTOR ARRANGEMENT

[72] Inventor: Melvin S. Nation, Bensenville, Ill.

[73] Assignee: Motorola, Inc., Franklin Park, Ill.

[22] Filed: Oct. 28, 1970

[21] Appl. No.: 84,835

[52] U.S. Cl. ........................317/117, 317/118, 317/101 CB, 339/18 B

[51] Int. Cl. ........................H02b 1/04

[58] Field of Search ..................317/99, 101, 101 R, 101 CB, 317/101 DH, 117, 118, 120; 339/18 R, 18 B

[56] References Cited

UNITED STATES PATENTS

| | | | |
|---|---|---|---|
| 3,052,821 | 9/1962 | Scoville | 317/101 R |
| 3,341,801 | 9/1967 | Brookman | 339/18 B |
| 3,360,689 | 12/1967 | Haury | 317/101 DH |

*Primary Examiner*—Thomas J. Kozma
*Assistant Examiner*—Gerald P. Tolin
*Attorney*—Mueller and Aichelle

[57] ABSTRACT

A housing for electronic equipment is provided with sidewall brackets that are secured in parallel relation with one another and with pins formed on the bracket to receive and guide a support rack containing electric or electronic components thereon. Rack receiving pins engage a first pair of slots on the support rack while guide pins engage a second pair of slots which are angularly formed in the support rack so that movement of the guide pins within the second slots provides a cam action to urge the entire support rack into electrical connection with fixedly mounted quick connectors secured to a barrier strip which is secured within the housing. The quick connectors are trifurcated female connectors to receive male connectors during the inserting operation of the support rack, and the trifurcated connectors are resilient to allow for slight angular movement between the connectors during their interconnection.

10 Claims, 10 Drawing Figures

INVENTOR.
MELVIN S. NATION

BY Mueller & Aichele

ATTORNEYS.

INVENTOR.
MELVIN S. NATION
BY Mueller & Aichele
ATTORNEYS.

INVENTOR.
MELVIN S. NATION
BY Mueller & Aichele
ATTORNEYS.

APPARATUS FOR QUICKLY MOUNTING AND ELECTRICALLY CONNECTING COMPONENTS IN A HOUSING WITH CAMMING CONNECTOR ARRANGEMENT

BACKGROUND OF THE INVENTION

This invention relates to apparatus for quickly mounting and electrically connecting components within a housing.

Generally, the mounting of electrical or electronic components for monitoring outdoor, high-power equipment would be on a circuit board or other support means to be connected within a housing and support therein. In many cases, the components would require additional electrical connections made thereto after the circuit board has been mounted within the housing. These connections were generally accomplished by a plurality of relatively complicated and time-consuming steps requiring a considerable amount of dexterity on the part of the installer. For example, an electrical apparatus, such as a circuit formed on a circuit board, would be mounted within a housing by screws at the corners thereof, or at least at some point thereon, and then additional electrical connections would be made by screw terminals or solder connections. In systems which require rapid repair of circuitry or components, it is sometimes desirable, if not entirely necessary, to remove the circuit board from the housing and replace the entire circuit board so that the old board can be taken into a shop for repair. With the complicated type of mounting and electrical connection of such circuit boards, this requires a considerable amount of time and as such, is costly.

In monitoring powerline circuits over long distances, a relay-operated monitor control circuit is mounted within a housing which, in turn, is secured to a powerline pole so that telemeter information can be transmitted as to the condition of the powerline. The purpose of such telemeter equipment is to facilitate repair of the powerlines, should such be necessary, by giving quick and accurate information where the repair is needed. However, should the telemeter equipment itself become defective, it would considerably increase the time of finding the trouble on the powerline so that the necessary repair con be made. It is therefore equally important that the telemeter equipment be easily repaired or replaced when necessary.

SUMMARY OF THE INVENTION

Accordingly, it is an object of this invention to provide improved apparatus for quickly mounting and electrically connecting an electrical circuit board within a housing without the use of tools, and wherein such connection is made in a minimum of time.

Another object of this invention is to provide an improved and simplified bracket and support frame arrangement which facilitates mounting of a circuit board in a manner whereby incorrect alignment of a component-carrying support rack and brackets within the housing will prevent connection of the terminals so that no damage will occur to the electrical components on the circuit board.

Yet another object of this invention is to provide an improved mounting apparatus for electrical components whereby mounting brackets are provided with means to guide a component-carrying support rack into proper alignment for the electrical connection.

Briefly, the mounting and interconnecting apparatus of this invention is formed of simple, metal stamped parts and fabricated, for example, by spot welding, or the like, to secure the respective metal components together as necessary. A pair of metal brackets, identical in configuration, are mounted within a housing, which is preferably of plastic material, so that the brackets are in parallel spaced-apart relation within such housing. These brackets contain receiving pins secured to one end thereof and guide pins secured to the other end thereof and the left- and right-hand characteristics of the brackets is determined by the positioning of these pins within selected ones of preformed holes within the brackets. A terminal barrier strip is mounted within the housing, or to the brackets therein, and extends between the brackets so as to have a plurality of trifurcated female connectors extending in a line perpendicular to the brackets. The electrical components of the particular circuit involved are secured to a support rack which is fabricated also of metal stamped parts, which may also include heavy gauge wire, and arranged to be quickly inserted into the housing and fully supported and completely electrically connected by a single motion. The support rack has side members maintained in parallel spaced-apart relation a distance to fit between the brackets mounted within the housing. The side members of the support rack include a first pair of slots to engage receiving pins secured to the brackets and a second pair of slots to engage guide pins secured to the brackets but at the opposite end thereof. With the support rack in place, so as to have the first slots engaging the receiving pins, a simple push of the support rack at the upper end thereof will cause a camming action between the second slots thereon and the engaged guide pins. The camming action will drive the support rack in a direction toward the terminal barrier strip so that quick connect terminals engage the trifurcated female connectors to make the necessary electrical connection.

DESCRIPTION OF THE PREFERRED EMBODIMENT

Figure 1:
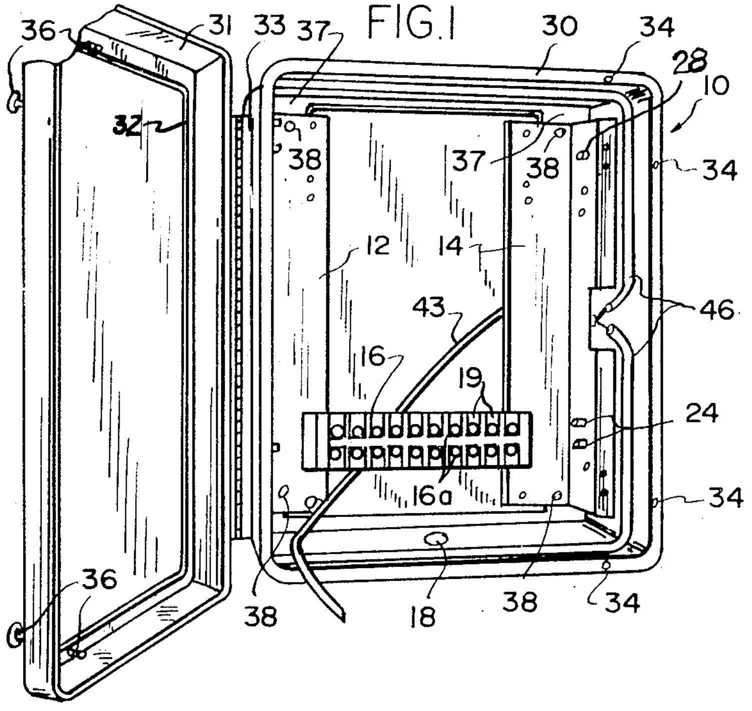
FIG. 1 is a perspective view of a housing in which brackets are secured to receive a support rack in accordance with this invention.
Figure 10:
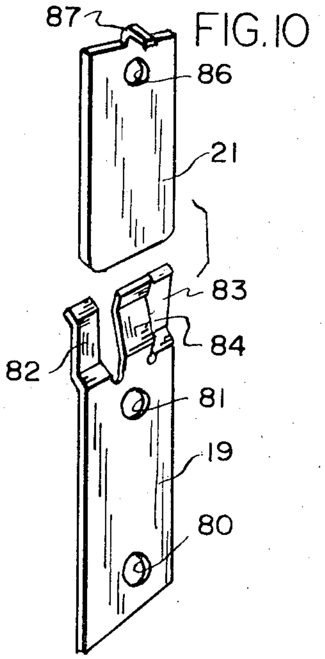
FIG. 10 illustrates a male connector and a trifurcated female connector to be used as quick connect means on the barrier strip within the housing of this invention.
Figure 2:
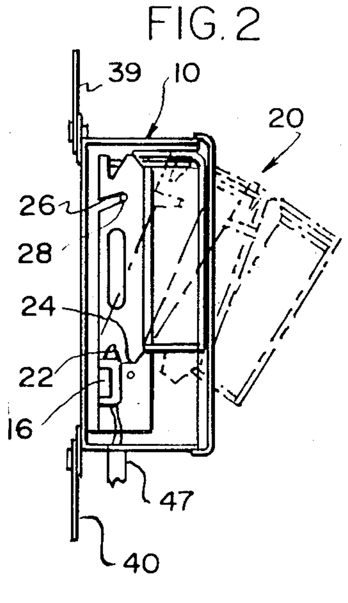
FIG. 2 is a side elevational view of the housing of FIG. 1 with a support rack shown in several positions as it is being inserted therein.
Figure 3:
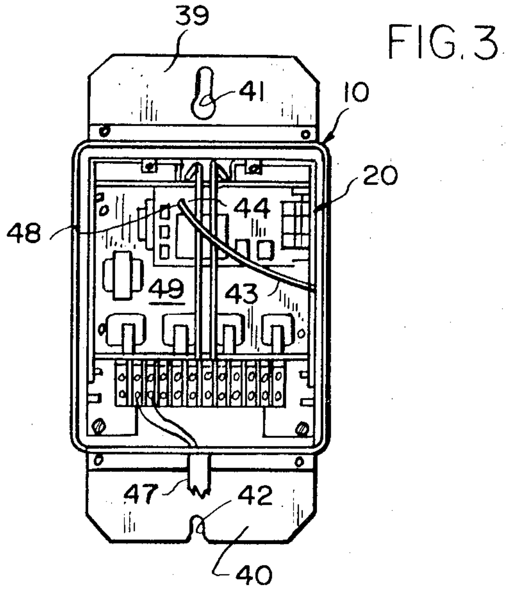
FIG. 3 is a front view of the housing of FIG. 2 with the support rack mounted therein.
Figure 4:
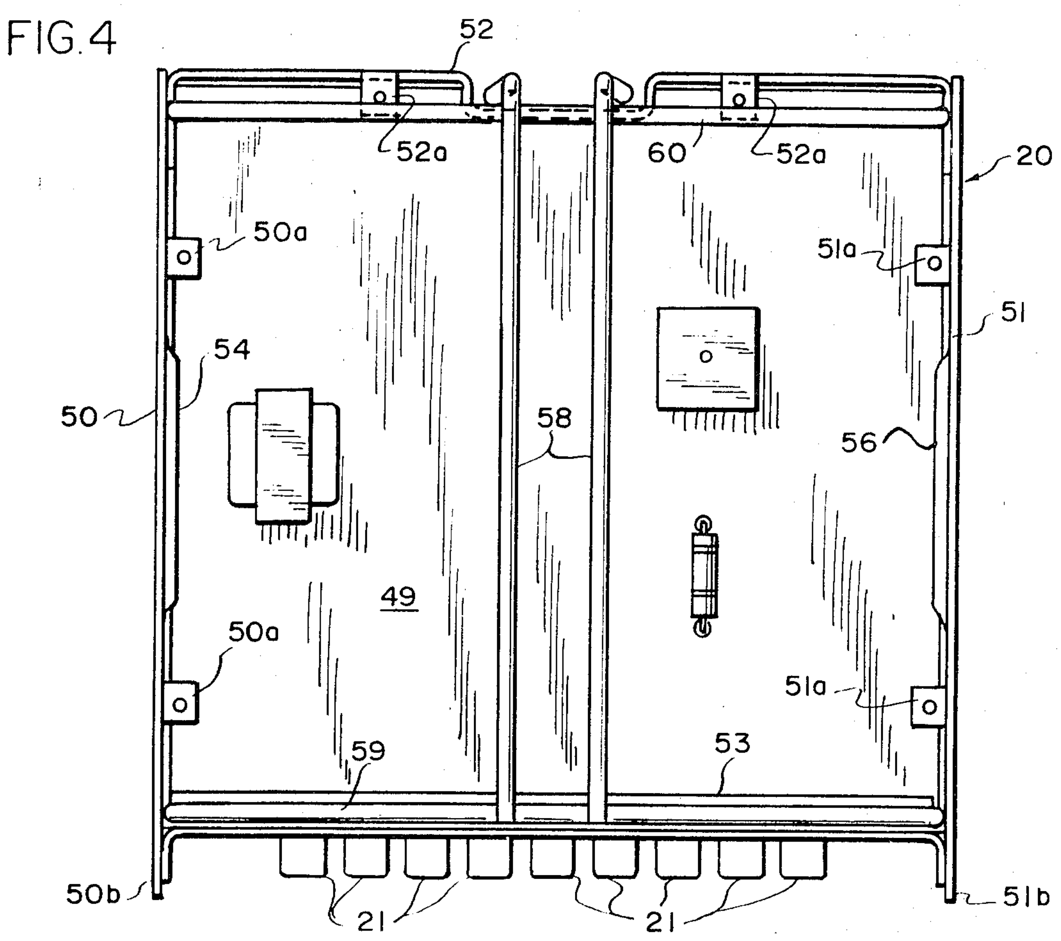
FIG. 4 is a top view of a support rack constructed in accordance with this invention.
Figure 5:
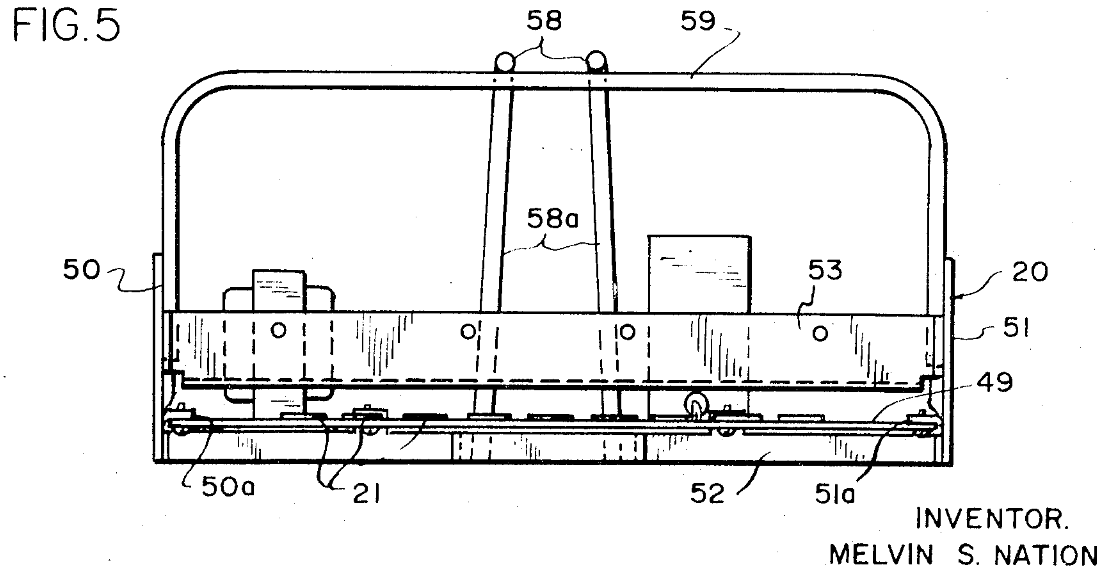
FIG. 5 is an end view of the support rack of FIG. 4.
Figure 6:
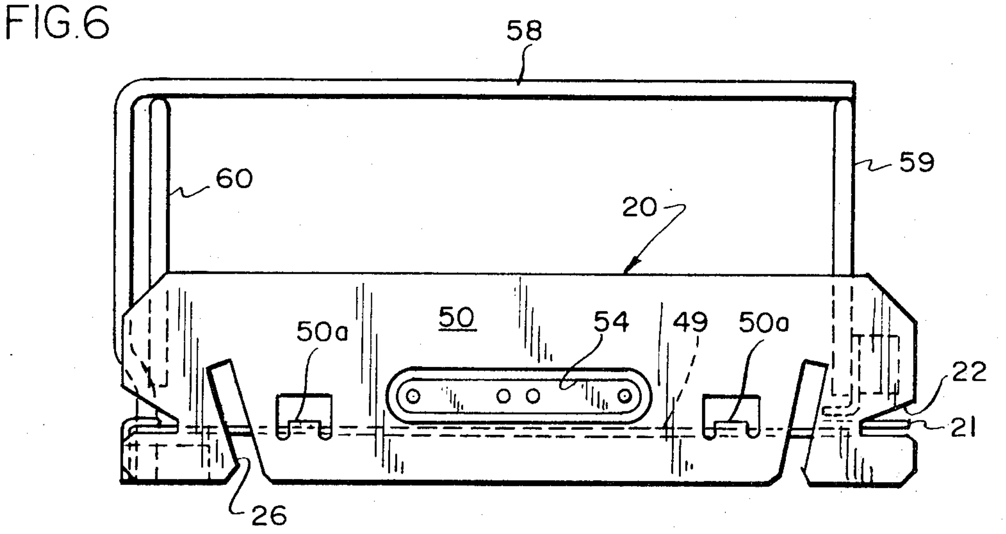
FIG. 6 is a side view of the support rack of FIG. 4.

Referring now to FIG. 1, there is shown a housing 10 of any suitable size and configuration and which is adapted to receive a pair of brackets 12 and 14 therein. The brackets 12 and 14 are secured within the housing by screws or rivets, or the like, and a terminal barrier strip 16 is secured to the rear wall of the housing or to the spaced-apart brackets 12 and 14. The terminal barrier strip 16 has a plurality of screw terminals **16*a* to which incoming connection can be made by leads of a cable which passes through the aperture 18 in the bottom wall of the housing 10. A plurality of trifurcated female connectors 19, FIG. 10, are secured to the barrier strip 16 by the plurality of screws 16*a* and they serve as quick connectors for a circuit arrangement which is to be positioned within the housing. That is, a support bracket 20, as seen in FIGS. 2 and 3, has an electronic circuit arranged thereon and portions thereof connected to respective ones of a plurality of male terminals 21, as seen in FIGS. 4, 5 and 6. These male terminals 21 will engage the trifurcated female connectors 19 for electrical connection while providing slight relative movement therebetween during the interconnecting thereof as the support rack 20** is urged into position.

The support rack 20 is positioned within the housing to have pin-receiving slots 22 therein engaging corresponding receiving pins 24 which extend in diametrically opposed directions from the brackets 12 and 14. The receiving pins are arranged to ensure that no electrical connection whatever is made to the respective ones of the trifurcated connectors 19 or any of the screw terminals 16*a* unless the support rack is positioned properly within the housing, in which instance only proper electrical connections are made. This assures that no electronic components are inadvertently connected to the wrong potential or polarity of potential to damage transistors or similar relatively delicate components within the circuit.

FIG. 2 illustrates the support rack 20 in the initial position within the housing 10 to have the slots 22 engaging the receiving pins 24. The angular displacement of the support rack during the initial insertion thereof is a somewhat natural position to achieve by the installer so that little or no training or experience is necessary to obtain the minimum amount of dexterity needed for insertion of the support rack into the housing. The support rack is then run home by pushing the upper end thereof rearward toward the rear wall of the housing. This action causes a pair of slots 26, formed on opposite sides of the support rack, to engage the guide pins 28 extending from the upper end of the brackets 12 and 14. The guide pins 28 act as camming devices within the slots 26 to urge the entire support rack downwardly a sufficient amount to ensure full engagement of the male terminals 21 with the trifurcated female connectors 19. Thus, complete mechanical and electrical connection of the support rack is made by a simple, one-handed, motion of the installer, and the possibility of inadvertent connections is eliminated.

Referring again to FIG. 1, the housing 10 preferably is made of plastic or steel and fashioned to be impervious to rain and snow to protect electronic components housed therein. A lip 30 is formed about the periphery of the open front wall of the housing and a door 31 has a gasket 32 formed therein to engage the lip 30 and form a tight seal therewith. The door 31 is hinged to the main body of the housing 10 by a piano hinge 33, it being understood that any suitable hinge mechanism can be used. It will also be noted that the aperture 18 for receiving incoming electrical lines may be a knockout-type aperture wherein a struck portion is partially cut through the bottom wall of the housing and a slight hammer blow will remove the circular plug to form the aperture 18. The lip 30 has a plurality of set-in threaded members 34, which may be brass, aluminum or steel, in the case of plastic housings, to receive correspondingly aligned screws 36 when the door is closed. The rear wall of the housing has thick wall portions 37 about the inner periphery thereof in which self-threaded screws or bolts 38 are inserted to hold the brackets 12 and 14 firmly in position within the housing 10.

When the housing 10 is used to receive a support rack 20 containing a radio transmitting device for monitoring, for example, powerline conditions, the housing may be equipped with hanger tabs 39 and 40 so that it can be mounted quickly and easily on a powerline pole in a minimum of time. The upper tab 39 is provided with a slotted hole 41 which has an enlarged portion to be positioned over the head of the screw or nail and then slide down through an elongated slotted portion, in a manner well known, and the bottom tab 40 has a notched area 42 centrally thereof to receive a screw firmly to hold the housing 10 to the powerline pole.

When the apparatus of this invention is used for monitoring powerline conditions and telemetering the information of such conditions, suitable RF connection means are required. To this end, a coax cable 43 is provided with a quick connect plug 44 at the end thereof with the other end of the coax 43 connected to a self-contained dipole antenna 46 formed within the housing 10. It will be understood in this instance that the housing 10 is of plastic or other nonmagnetic material through which RF energy can pass. When the support rack 20 is positioned within the housing 10, electrical power is applied thereto through a power cable 47 which is connected to the screw terminals 16*a* of the terminal barrier strip 16. The connection between the power cable 47 and the electronic components on the support rack 20 is made, however, through the quick connect arrangement of the trifurcated connector 19 and terminal 21. The coax cable 43 has the plug 44 thereof connected to a receptacle 48 formed on a circuit board 49 of the support rack 20. Thus, all electrical connections to the support rack 20 are made without the need of tools of any kind, as illustrated in FIGS. 2 and 3.

Referring now to FIGS. 4, 5 and 6, wherein the support rack 20 has the top, end and side views thereof illustrated in more detail. The circuit board 49 is secured to the support rack 20 within the metal framing structure thereof and has a plurality of electronic components secured to the circuit board, and only several of such electronic components are illustrated for clarity. The electronic circuit on the circuit board 49 may be any circuit arrangement to be mounted and connected within a housing in accordance with this invention. For purposes of illustration, the circuit here is a radio transmitter telemetering system for monitoring powerline operation.

The support rack 20 has side members 50 and 51 of stamped metal construction with bent over tab portions 50*a* and 51*a*, respectively. The side members 50 and 51 are maintained a fixed distance apart by a pair of cross braces 52 and 53 at the upper and lower ends, respectively, of the side members. The upper cross brace 52 includes a plurality of struck-out and bent over tabs 52*a* which fall in the same plane as the bent over tabs 50*a* and 51*a*. The circuit board 49 is secured within the support rack 20 by screws or rivets which pass through the tabs 50*a*, 51*a* and 52*a*. The bottom cross brace 53 may be provided with apertures to receive standoff devices and mounting screws, if desired. The male connectors 21 are illustrated extending from the circuit board 49 just below the bottom cross brace 53. It will be noted that the extent of the connectors 21 is less than the lower extent 50*b* and 51*b* of the side members 50 and 51, respectively, so that the connectors 21 will not engage any of the terminals of the terminal barrier strip 16 unless the rack is in proper alignment and position.

The side members 50 and 51 are provided with depressed contoured portions 54 and 56, respectively, to add rigidity in both the longitudinal and transverse directions of the metal stamped part. To facilitate installation of the support rack 20 into the housing 10, a handle 58 is formed substantially centrally of the support rack and preferably is made of heavy gauge wire. The handle 58 is supported by a pair of wire side extensions located at the upper and lower end of the support rack and which span substantially the entire width thereof and have turned over ends secured inwardly of the side members 50 and 51. The entire structure of the support rack 20 preferably is of welded construction to form a rigid member.

Figure 7:
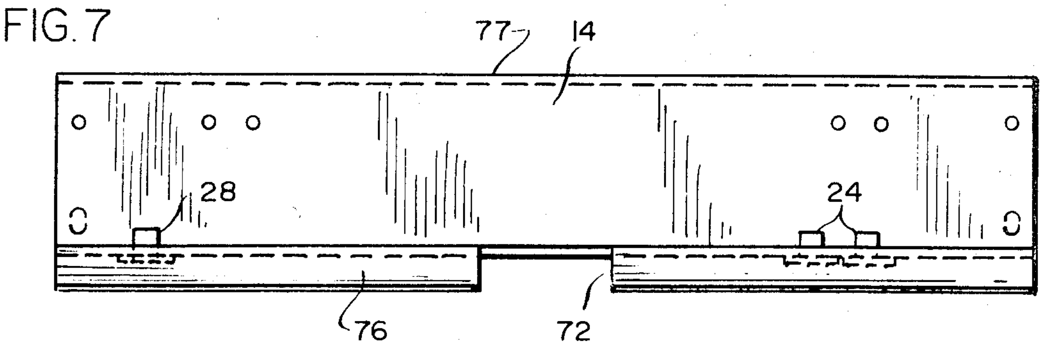
FIG. 7 is a top view of a bracket to be mounted in the housing of FIG. 1.
Figure 8:
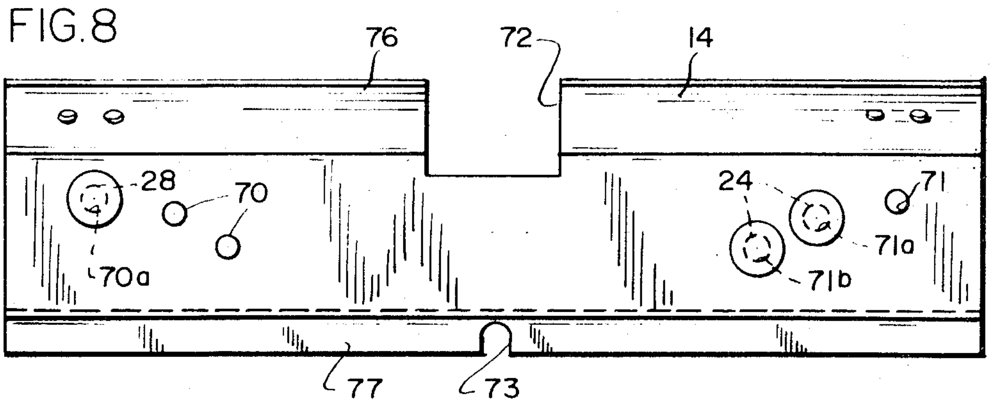
FIG. 8 is a side view of the bracket of FIG. 7.
Figure 9:
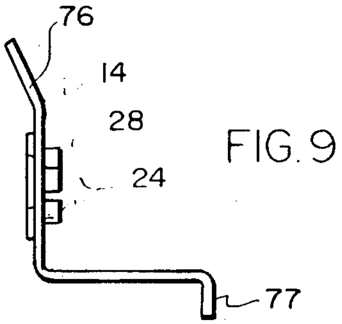
FIG. 9 is an end view of the bracket of FIGS. 7 and 8.

Referring now to FIGS. 7, 8 and 9, the bracket 14 is illustrated in full detail. It will be understood that the brackets 12 and 14 are identical in configuration and stamped from the same die thereby providing a cost savings. The brackets are provided with duplicate hole arrangements so that the bracket can be made either a left- or a right-hand bracket depending upon what holes are used to receive the receiving pins or guide pins. For example, a group of holes 70 is formed at one end of the bracket 14 while a second group of holes 71 is formed at the other end thereof. When the bracket 14 is used as is here illustrated, as the right-hand bracket, a single pin 28 is inserted into the hole 70*a* closest to the end of the bracket of are inserted into holes 71*a* group of holes 70 and two pins 24 are inserted into holes 71*a* and 71*b* of the group of holes 71. The pins are provided with flat heads which are located on the side of the brackets facing the inner walls of the housing and welded in position by spot welding, or the like. The bracket 14 includes a cutout segment 72 at the upper end and substantially in the center thereof so as to provide an area for connecting the dipole antenna 46 to the coax cable 43. Also a notch 73 is provided in the bracket 14 to form a clearance for the coax cable 43 which then passes underneath the bracket 14. The upper sidewall of the bracket 14 has a diverging bent over portion 76 and provides somewhat a guide means for receiving the support rack 20 without causing hand-up or interference with any of the components within the housing 10. A downwardly turned lower edge 77 is provided on the bracket 14 and adds rigidity to the bracket as well as spacing behind the bracket as it is mounted within the housing 10.

Referring now to FIG. 10, the quick connectors used between the support rack 20 and the terminal barrier strip 16 are illustrated. The trifurcated female quick connector 19 is provided with a pair of apertures 80 and 81 through which the screws **16*a* of the same terminal connection pass to hold the connector 19 firmly on the barrier strip with the trifurcated end thereof extending upwardly. The trifurcated end is formed of laterally displaced end portions 82 and 83 and an oppositely directed, laterally displaced center portion 84. The laterally displaced portions 82, 83 and 84** are sufficiently resilient to allow slight angular displacement thereof during the last few degrees of arcuate movement of the support rack as it is being pushed home.

The male connector 21 has an aperture 86 and a small bent over tab portion 87 to which electrical connection can be made on the printed circuit board 49 in a well-known manner.

What has been described is a simple and economical means for providing a mounting and connecting arrangement for electrical components to be positioned within a housing. The utility of such arrangement is here illustrated with a transmitting-monitoring device to monitor powerline conditions. Thus, the housing 10 is equipped with means for mounting it to a powerline pole, it being understood that the housing 10 can be mounted in any location depending on its use. Therefore, variations and modifications of this invention may be effected without departing from the spirit and scope of the novel concepts disclosed and claimed herein.

I claim:

1. Apparatus for quickly mounting and electrically connecting electric components within a housing, including in combination:

brackets adapted to be mounted in the housing with receiving pins secured to said brackets near one end thereof in positions diametrically opposed with respect to each other, and guide pins secured to said brackets near the other end thereof in positions diametrically opposed with respect to each other;

connector means adapted to be mounted within the housing at said one end of said brackets and extending between said brackets with a plurality of discrete spaced apart connectors formed thereby; and a support rack for receiving components arranged in an electric circuit thereon, said support rack having side members maintained in parallel relation, spaced apart a distance to fit between the brackets and having a plurality of spaced-apart first connectors extending between said side members, each of said first connectors engaging corresponding ones of said discrete spaced apart connectors, said side members having first slots engaging with said receiving pins and second slots engaging with said guide pins, said second slots being formed at an angle in said side members to work against said guide pins in camlike fashion, whereby positioning said support rack in the housing so that the side members are between said brackets causes said plurality of first connectors to make connection with said plurality of discrete spaced-apart connectors.

2. The apparatus of claim 1 wherein said bracket means is a pair of brackets which are substantially L-shaped in cross section with a first portion secured to the rear wall of said housing and a second right-angle portion extending from said rear wall and in parallel spaced relation with the second portion of the other of said pair of brackets, said second portion of each bracket diverging outwardly at the uppermost end thereof.

3. The apparatus of claim 2 wherein each of the brackets of said pair of brackets is initially formed identical with one another with the same number of holes at the respective ends thereof, and the left- and right-hand characteristic of said brackets is determined by which ones of the holes receive said receiving pins and said guide pins.

4. The apparatus of claim 1 wherein said support rack further includes a pair of cross braces extending between said side members at the ends thereof, tabs formed by bent over portions of said side members and said cross braces, and a circuit board secured to said tabs within the space defined by said side members and said cross braces.

5. The apparatus of claim 1 wherein said support rack includes a wire frame member secured between said side members at the ends thereof and a wire handle section formed as part of said wire frame for gripping the support rack to insert and remove the same from said housing.

6. The apparatus of claim 1 wherein said plurality of discrete spaced-apart connectors are trifurcated female connectors.

7. Apparatus for quickly mounting and electrically connecting electric components within a housing, including in combination:

a pair of brackets adapted to be mounted in the housing and positioned in parallel spaced-apart relation therein:

receiving pins secured to said pair of brackets near one end thereof in positions diametrically opposed with respect to each other;

guide pins secured to said pair of brackets near the other end thereof in positions diametrically opposed with respect to each other;

a terminal barrier strip adapted to be mounted within the housing at said one end of said pair of brackets and extending perpendicularly between said pair of brackets;

a plurality of spaced-apart quick connectors secured to said terminal barrier strip; and a support rack for receiving electric components arranged in an electric circuit thereon, said support rack having side members maintained in parallel relation spaced apart a distance to fit between said brackets and having a plurality of spaced-apart first connectors extending between said side members, each of said first connectors engaging with a corresponding one of said plurality of quick connectors, said side members having first slots engaging with said receiving pins and second slots engaging with said guide pins, said second slots being formed at an angle in said side members to work against said guide pins in camlike fashion, whereby positioning said support rack in the housing so that the side members are between said pair of brackets causes said plurality of first connectors to make connection with said plurality of quick connectors on said terminal barrier strip and said first slots to engage with said receiving pins, and rearward movement of the upper end of said support rack causes the guide pins to engage said second slots in camlike fashion and urge the entire support rack toward the terminal barrier strip for interconnection between said connectors on said support rack and said quick connectors on said terminal barrier strip.

8. The apparatus of claim 7 wherein said pair of brackets are substantially L-shaped in the cross section with a first portion secured to the rear wall of said housing and a second right-angle portion extending from said rear wall and in parallel spaced relation with the second portion of the other of said pair of brackets, said second portion of each bracket diverging outwardly at the uppermost end thereof.

9. The apparatus of claim 8 wherein each of the brackets of said pair of brackets is initially formed identical with one another with the same number of holes at the respective ends thereof, and the left- and right-hand characteristic of said brackets is determined by which ones of the holes receive said receiving pins and said guide pins.

10. The apparatus of claim 7 wherein said support rack includes a wire frame member secured between said side members at the ends thereof and a wire handle section formed as part of said wire frame for gripping the support rack to insert and remove the same from said housing.

* * * * *